United States Patent [19]

Spies et al.

[11] 4,163,268
[45] Jul. 31, 1979

[54] CIRCUIT ARRANGEMENT FOR MONITORING READINESS FOR OPERATION OF ACTUATING DEVICES OF A SAFETY APPARATUS FOR VEHICLES

[75] Inventors: Johann Spies, Pfaffenhofen; Alfons Wöhrl, Schrobenhausen, both of Fed. Rep. of Germany

[73] Assignee: Messerschmitt-Bolkow-Blohm GmbH, Munich, Fed. Rep. of Germany

[21] Appl. No.: 784,334

[22] Filed: Apr. 4, 1977

[30] Foreign Application Priority Data

Apr. 3, 1976 [DE] Fed. Rep. of Germany ....... 2614491

[51] Int. Cl.² ............................................ H02H 3/00
[52] U.S. Cl. .................... 361/1; 307/10 R; 340/61; 280/735
[58] Field of Search ................ 361/90, 251, 257, 264, 361/266, 1; 180/103 A; 307/10 R; 340/61, 248 BC

[56] References Cited

U.S. PATENT DOCUMENTS

| 3,622,974 | 11/1971 | Best et al. .................... 180/103 A X |
| 3,629,816 | 12/1971 | Gillund ......................... 180/103 A X |

*Primary Examiner*—Harry E. Moose, Jr.
*Attorney, Agent, or Firm*—Toren, McGeady and Stanger

[57] ABSTRACT

A circuit monitors the operational readiness of the trigger arrangement in a safety device that protects passengers in a vehicle, for example, the ignitors which inflate the air bags of a vehicle in response to an actual or impending collision. The triggers are parts of two series connected safety circuits which include a filter-controlled thyristor and a Zener diode having a grounded anode. A supplemental safety circuit connected to a tap between the safety circuits uses two comparators to compare the tap voltage with the upper and lower limit signals. When the limit signals are exceeded the safety circuit is disconnected from the system's collision detector.

12 Claims, 1 Drawing Figure

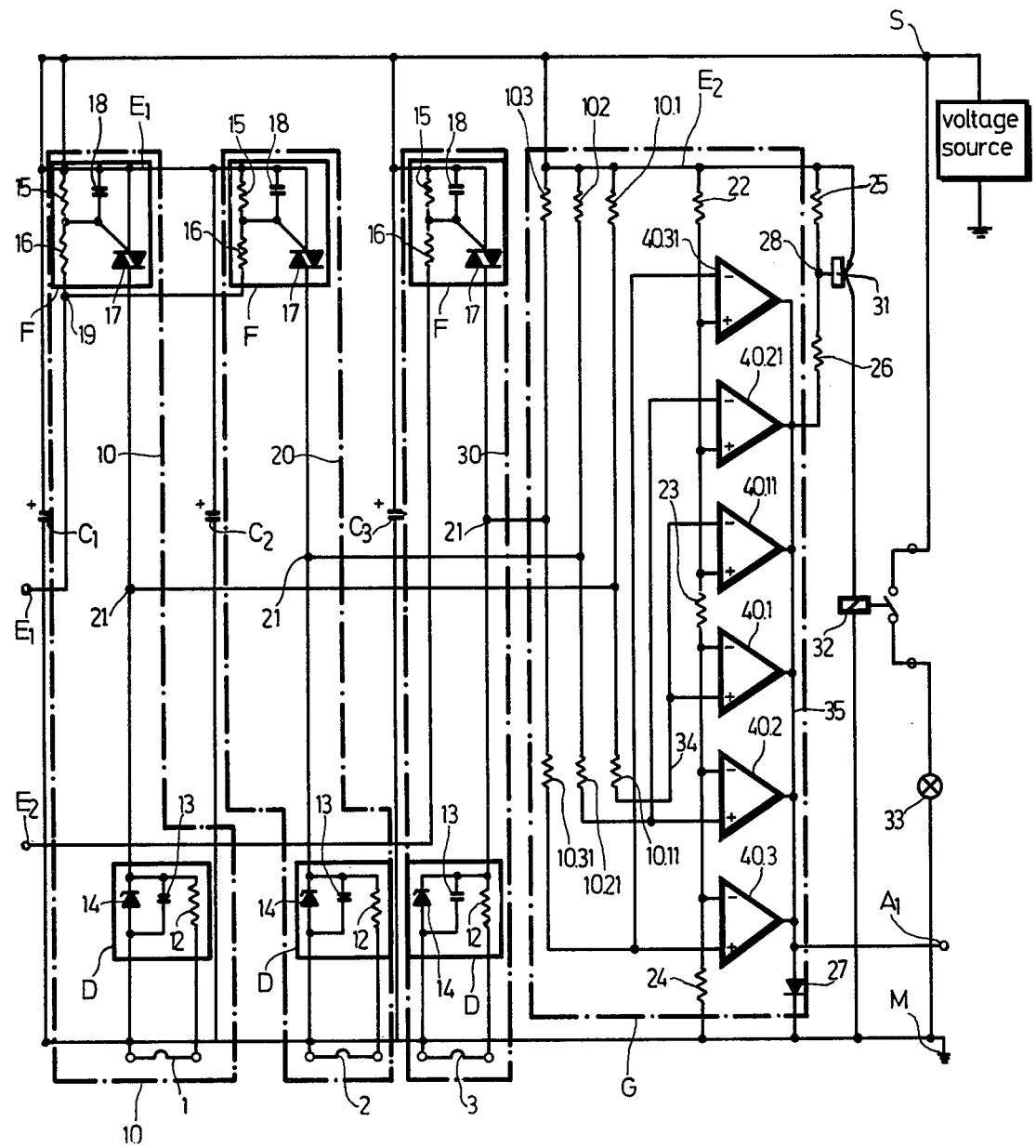

CIRCUIT ARRANGEMENT FOR MONITORING READINESS FOR OPERATION OF ACTUATING DEVICES OF A SAFETY APPARATUS FOR VEHICLES

REFERENCE TO RELATED APPLICATION

This invention is related to our application, filed on or about Mar. 22, 1977, entitled "Sensor System for Releasing Passive Safety Apparatus in Car Crashes", Ser. No. 780,015.

The invention relates to a circuit arrangement for monitoring readiness for operation of actuating devices of a safety apparatus for vehicles, which safety apparatus can be actuated by a collision sensor, with at least one comparator for the production of an error signal in the event of vagrant currents, short circuits in the conductor or similar faults.

Circuit arrangements of this kind are necessary when exacting demands are made on the operational accuracy of actuating devices, as is the case, for instance, with collision sensors of motor vehicles.

In such apparatus both the signal transmitting part, such as a collision sensor operating with piezo elements, and the part comprising the actuating devices for an air cushion or the like have to function with the maximum reliability.

The safe and reliable operation of the actuating devices is decisively governed by the possibility of distinguishing an actuation signal emitted by the collision sensor from fault signals of any other origin and of suppressing such fault signals and by the possibility of the automatic recognition of such fault signals within such a switching arrangement, i.e. by correct operation of the actuating devices, unaffected by errors of all kinds. Ger. Unexam. Spec. No. 2207831, pp. 7 et seq., 12,13,14 et seq., describes a circuit arrangement in which the voltage potential derived via a Zener diode and a resistor is compared via a NAND gate with those points in the circuit which are to be verified. In the event of deviations from the preselected values a pilot lamp is switched on via a relay circuit.

It is true that when a pilot lamp comes on this indicates that the apparatus is incapable of functioning, but it does not prevent the air cushion from being actuated accidentally.

The purpose of the invention is to provide a circuit arrangement, of the type mentioned at the beginning, which in the event of a voltage signal from the collision sensor will not prevent the reliable performance of the preselected action, such as the ignition, and which will nevertheless be capable of monitoring all faults liable to occur and of preventing the switching devices monitored from being incorrectly actuated, apart from giving an indication of the fault.

Based on a circuit arrangement of the type mentioned at the beginning, the invention enables this object to be achieved by a system in which the actuating devices form parts of two safety circuits connected in series, which mainly consist of a semi-conductor switch controlled via a filter and of a Zener diode of which the anode is connected to mass potential, while a further safety circuit is added in each case via a tap situated between the two safety circuits and has two comparators for each actuating device, the tapped voltage signal being conveyed, in each case via a voltage divider generating a reference voltage, to the inverting input of whichever comparator is the first and to the non-inverting input of whichever comparator is the second, while whichever input of the first comparator is non-inverting and whichever input of the second comparator is inverting are connected to a voltage divider defining an upper and a lower comparison limit, the fault signal being derivable from the parallel-connected outputs of the comparators.

The invention provides that as a reliable means of preventing the apparatus from being actuated incorrectly the fault signal is to serve to switch off the inputs of the circuit arrangement.

A further embodiment of the invention provides that in order to protect the actuating devices from fault voltage of any origin that barrier layer of the semi-conductor switch which has the highest blocking voltage is to be connected to the output and that the breakdown voltage of the Zener diode is greater than the maximum output voltage of the detonation circuit.

The particular advantage offered by the invention resides in the economical way in which high reliability can be ensured, owing to the intrinsic control which can be effected at certain critical points of the circuit arrangement.

Thanks to the universal structure and great reliability of the circuit arrangement it can also be used for monitoring other types of apparatus, such as explosive charges, alarm installations, machinery etc.

The invention will be described below by reference to an example illustrated in the drawing.

The circuit arrangement shown in the one drawing has actuating devices consisting of actuating stages 10,20 and 30, containing detonator caps 1,2 and 3. Instead of detonator caps it would also be possible to actuate switches or to set up similar control or operating processes. The actuating stages are all constructed on the same lines, so that the same reference numbers will be used for the same switching elements.

The actuation signal or signals are conveyed via a signal line $E_1$ and $E_2$ to the circuit arrangement, which will be described in detail in due course. It is also possible, however, to provide signal lines for each of the actuation stages 10,20 and 30, so that actuation signals coming from different places will lead simultaneously or at different moments to the actuation of one or more actuation stages. Finally, it is fundamentally possible to provide any desired number of actuation stages 10 to n.

The supply of current to the circuit arrangement is effected via line S which passes through a battery and which charges the capacitors $C_1, C_2$ and $C_3$. These capacitors serve to supply current to the actuation stages in the event of a failure in the battery voltage over a certain preselected period, for filtering voltage peaks in the supply part and as detonation energy accumulators for the detonating caps 1,2,3.

With each detonating cap 1 to 3 a resistor 12 is connected in series. Connected in parallel therewith is a parallel system consisting in each case of one capacitor 13 and a Zener diode 14. Each Zener diode, with its associated parallel circuit consisting of resistor and capacitor, forms a safety circuit D. One further safety circuit F is connected in series with each of the safety circuits D and in each case consists of a three-pole semi-conductor switch 17 of which the main electrode is connected to the line S of the external voltage supply. A voltage divider consisting of the resistors 15 and 16 is likewise connected by one end to the line S. The other end is connected with the signal line $E_1$ serving to initiate the actuation signal. The control electrode of the semi-conductor switch 17 is connected to the voltage divider 15 and 16 and to a capacitor 18 which in its turn is connected to the line S.

If the actuation signal is required to actuate a number of actuation stages on the input line $E_1$, then a second actuation stage 20 is fed via a tap 19, and so forth. A further safety circuit G, which consists of comparators 40.1, 40.11 or, according to the number of detonation circuits 10,20,30 in the example, of a total of six comparators 40.1 to 40.31, is connected to a tap 21 between the two safety circuits D and F, via a voltage divider consisting of resistors 10.1,10.11. A voltage divider consisting of resistors 22,23 and 24 is also situated between the line S and mass potential.

As regards matters of detail, a line 34 leads from the resistor 10.11 to the comparators 40.1 and 40.31, while the resistor 10.1 is connected to the line S of the external voltage source. The resistor 10.11 is connected with the non-inverting input of the comparator 40.1 and with the inverting input of the comparator 40.11, while the remaining inputs of the comparators 40.1 and 40.11 lead to the voltage divider 22,23,24.

The outputs of the comparators are connected to one common line 35 and thus have an OR linkage. The outputs of the comparators 44.1 and 40.11 are also situated between a voltage divider, connected to the line S and consisting of the resistors 25 and 26, and a diode 27 of which the cathode is connected with the mass potential M of the external voltage source. The base of a transistor 31, of which the emitter is connected with the line S, is connected to the tap 28 of the voltage divider 25,26. Via the collector of the transistor 31 a relay 32 is controlled by which an alarm lamp 33 can be switched on and off, while the line 35 leads to a terminal $A_1$ from which, in the event of a fault, a fault signal can be derived by which the inputs $E_1$ and $E_2$ can be switched off in a known manner.

As already explained, the actuation stages 10,20 and 30 can be interconnected in any desired manner, and any required number of them can be used. In the example the actuation stage 20 is connected with the actuation stage 10 via the tap 19 to the same signal input $E_1$, while the actuation stage 30 has its own signal input $E_2$. As may be seen from the drawing, the linkage is effected in the same manner as for the actuation stage 10.

If no fault prevails a detonation signal coming from the terminal $E_1$, for example, leads to the actuation of the semi-conductor switch 17, so that the capacitor $C_1$ discharges via the resistor 12 to the detonating cap 1, as a result of which, for example, the gas generators of an air cushion belonging to the vehicle and not shown in the drawing are activated.

The resistor 16 prevents vagrant currents in the signal line $E_1$ from accidentally igniting the semi-conductor switch 17 of the safety circuit F. The capacitor 18 is dimensioned to ensure that the semi-conductor switch 17, when switch off, cannot be ignited from the external voltage source. By the RC element 15/18, also serving as a filter, the moment is determined at which the semi-conductor switch 17 is to be caused to assume the conductive state. The semi-conductor switch 17 is an additional switching element with which the barrier layer having the highest blocking voltage is connected up to the output, so that the solid body switch will not be switched through by induced fault voltage peaks at the output.

The safety circuits D serve as additional protection against induced extraneous fault voltages. This ensures that negative fault impulses will be limited by the forward threshold voltage of the Zener diode 14 in conjunction with 12 and 13, while in the case of positive fault impulses the limitation will be effected by the breakdown voltage of the Zener diode 14. In this system the breakdown voltage has been made higher than the maximum detonation output voltage in the semi-conductor switch 17. This circuit prevents the permissible blocking voltage of the switch 17 from being exceeded or this switch being actuated as a result of a rate effect (voltage increase speed), without preventing the desired ignition of the detonating cap.

The comparator used consists of comparison circuits with input stages consisting of difference transistors with collectors connected to mass potential. This provides a means of correctly evaluating voltages even in the range of afew millivolts in respect of mass potential, so that the detonation devices, i.e. the detonating caps, including their wiring, can be verified. The voltage divider resistors at the same time serve to protect the comparators against overloads.

The voltage divider 22,23 and 24 determines a lower and an upper comparison voltage limit with which a voltage drop in the detonating caps 1,2 and 3 is tapped via the voltage divider resistors 10.1, 10.2 and 10.3. If any value occurs outside the established resistance of the detonation circuit or if the voltage in the capacitors $C_1, C_2$ and $C_3$ falls below a certain minimum, the fault signal will be thereby generated and the transistor 31 driven hard, resulting in the response of the relay 32, which in its turn causes the alarm lamp 33 to be switched on or any desired alternative measures to be taken at this point, or which causes the inputs $E_1$ and $E_2$ to be switched off, e.g. via $A_1$.

The detonator caps 1,2 and 3 serve a detonating function and may be considered as actuating or release elements.

We claim:

1. For a collision-sensor responsive vehicle safety device, a trigger circuit comprising: a pair of series-connected safety circuits, said pair including a safety release element and a solid switch as well as a filter for controlling the solid state switch and a Zener diode having a grounded anode, a tap connected between said safety circuits of said pair, a supplemental safety circuit connected to said tap, said supplemental safety circuit including two comparators for said release element, coupling means for coupling the voltage of the tap to the non-inverting input of the respective second comparator and the inverting input of the first comparator, and a voltage divider defining an upper and a lower reference voltage limit, said voltage divider being connected to the inverting input of the second comparator and the non-inverting input of the first comparator, connecting means connecting the outputs of the comparators in parallel for forming error signals.

2. A circuit as in claim 1, wherein said thyristor includes barrier layers one of said barrier layers having the highest reverse voltage said one of said barrier layers having the highest reverse voltage being connected to the tap the Zener diode having a breakdown voltage which is higher than the maximum output voltage of the firing circuit.

3. For a collision responsive vehicle safety device, responsive to a trigger signal and having an actuating element, a monitor circuit comprising:

a pair of series connected safety circuits for responding to the trigger signal for said actuating element, the pair being connected to said actuating element and including a solid state switch as well as a filter connected to the switch for controlling the solid state switch and a Zener diode having a grounded anode, a tap connected between said safety circuits of said pair, a supplemental safety circuit connected to said tap, said supplemental safety circuit including two comparators for said actuating element, coupling means for coupling the voltage of the tap to the non-inverting input of the respective second comparator and the inverting input of the first comparator, and a voltage divider defining an upper and lower reference voltage limit, said voltage divider being connected to the inverting input of the second comparator and the non-inverting input of the first comparator, connecting means connecting the outputs of the comparators in parallel for forming error signals.

4. A circuit as in claim 3, wherein said thyristor includes barrier layers one of said barrier layers having the highest reverse voltage said one of said barrier layers having the highest reverse voltage being connected to the tap, the Zener diode having a breakdown voltage which is higher than the maximum output voltage of the firing circuit.

5. For an operating device which is to respond to an input signal by operating a safety actuating element, a monitor circuit comprising:

a pair of series connected safety circuits for responding to the trigger signal for the actuating element, said pair being connected to said actuating element and including a solid state switch as well as a filter connected to the switch for controlling the solid state switch and a Zener diode having a grounded anode, a tap connected between said safety circuits of said pair, a supplemental safety circuit connected to said tap, said supplemental safety circuit including two comparators for each release element, coupling means for coupling the voltage of the tap to the non-inverting input of the respective second comparator and the inverting input of the first comparator, and a voltage divider defining an upper and lower reference voltage limit, said voltage divider being connected to the inverting input of the second comparator and the non-inverting input of the first comparator, connecting means connecting the outputs of the comparators in parallel for forming error signals.

6. A circuit as in claim 5, wherein said thyristor includes barrier layers one of said barrier layers having the highest reverse voltage said one of said barrier layers having the highest reverse voltage being connected to the tap, the Zener diode having a breakdown voltage which is higher than the maximum output voltage of the firing circuit.

7. For a collision sensor responsive vehicle safety device, a trigger circuit comprising:

a plurality of pairs of safety circuits, the safety circuits of each pair being series connected with each other, each pair including a safety release element and a solid state switch as well as a filter for controlling the solid state switch and a Zener diode having a grounded anode, a plurality of taps each connected between the safety circuits of a pair, a supplemental safety circuit connected to said taps, said supplemental safety circuit including two comparators for each release element, coupling means coupling the voltage of the tap to the non-inverting input of the respective second comparator and the inverting input of the first comparator, and a voltage divider defining an upper and a lower reference voltage limit, said voltage divider being connected to the inverting input of the second comparator and the non-inverting input of the first comparator, connecting means connecting the output of the comparators in parallel for forming error signals.

8. A device as in claim 7, wherein the number of pairs is equal to the number of release elements and the number of comparators is twice the number of release elements.

9. For a collision responsive vehicle safety device, responsive to a plurality of trigger signals and having a plurality of actuating elements, a monitor circuit comprising:

a plurality of pairs of safety circuits, each of the pairs for responding to one of the trigger signals for each release element, said safety circuits in each pair being series connected with each other, each pair being connected to one of said actuating elements and including a solid state switch as well as a filter connected to the switch for controlling the solid state switch and a Zener diode having a grounded anode, a tap connected between said safety circuit of each of said pairs, a supplemental safety circuit connected to each of said taps, said supplemental safety circuit including two comparators for each actuating element, coupling means for coupling the voltage of the tap to the non-inverting input of the respective second comparator and the inverting input of the first comparator, and a voltage divider defining an upper and lower reference voltage limit, said voltage divider being connected to the inverting input of the second comparator and the non-inverting input of the first comparator, connecting means connecting the outputs of the comparators in parallel for forming error signals.

10. A circuit as in claim 9, wherein the number of pairs is equal to the number of release elements, the number of comparators being twice the number of actuating elements.

11. For an operating device which is to respond to a plurality of input signals by operating a plurality of actuating elements, a monitor circuit comprising:

a plurality of pairs of safety circuits, the safety circuits of each pair being connected in series with each other, said pairs of responding to the trigger signals for each actuating element, each of said pairs being connected to one of said actuating elements and including a solid state switch as well as a filter connected to the switch for controlling the solid state switch and a Zener diode having a grounded anode, a plurality of taps each connected between said safety circuits of a pair, a supplemental safety circuit connected to said tap, said supplemental safety circuit including two comparators for each release element, coupling means for coupling the voltage of the tap to the non-inverting input of the respective second comparator and the inverting input of the first comparator, and a voltage divider defining an upper and lower reference voltage limit, said voltage divider being connected to the inverting input of the second comparator and the non-inverting input of the first comparator, connecting means connecting the inputs of the comparators in parallel for forming error signals.

12. A circuit as in claim 11, wherein the number of pairs is equal to the number of actuating elements, the number of comparators is twice the number of actuating elements.

* * * * *